United States Patent [19]
Shinbo et al.

[11] Patent Number: 5,463,249
[45] Date of Patent: Oct. 31, 1995

[54] ELECTRONIC CIRCUIT SYSTEM UNIT WITH WIRING SUBSTRATE

[75] Inventors: Yutaka Shinbo, Hino; Takeshi Kajimoto, Takarazuka; Mitsuteru Kobayashi, Hanno; Katsuyuki Sato, Akishima, all of Japan

[73] Assignee: Hitachi, Ltd., Tokyo, Japan

[21] Appl. No.: 982,169

[22] Filed: Nov. 24, 1992

[30] Foreign Application Priority Data

Nov. 27, 1991 [JP] Japan ................... 3-312182

[51] Int. Cl.⁶ ................... H01L 23/48; H01L 29/44; H01L 29/52; H01L 29/60
[52] U.S. Cl. ................... 257/690; 257/723; 257/724
[58] Field of Search ................... 257/690, 208, 257/202, 723, 724

[56] References Cited

U.S. PATENT DOCUMENTS

| | | | |
|---|---|---|---|
| 4,484,215 | 11/1984 | Pappas | 357/80 |
| 4,675,717 | 6/1987 | Herrero et al. | 257/691 |
| 4,755,910 | 7/1988 | Val | 257/687 |
| 4,965,653 | 10/1990 | Otsuka et al. | 257/690 |
| 5,027,188 | 6/1991 | Owada et al. | 357/68 |
| 5,237,204 | 8/1993 | Val | 257/723 |
| 5,239,448 | 8/1993 | Perkins et al. | 257/778 |

*Primary Examiner*—William Mintel
*Assistant Examiner*—Roy Potter
*Attorney, Agent, or Firm*—Pennie & Edmonds

[57] ABSTRACT

In an electronic circuit system unit having a semiconductor integrated circuit unit on a wafer scale, a semiconductor wafer (a semiconductor integrated circuit unit on a wafer scale) and a print wiring substrate are laid to overlap each other and semiconductor pellets are mounted on the print wiring substrate in the overlapping area of the print wiring substrate and the semiconductor wafer. In said electronic circuit system unit, an area being a part of the periphery of the semiconductor wafer is protruded from the periphery of the print wiring substrate being placed to overlap the semiconductor wafer, and the semiconductor wafer and the print wiring substrate are electrically connected to each other in an area being a part of the protruded part through wires.

19 Claims, 8 Drawing Sheets

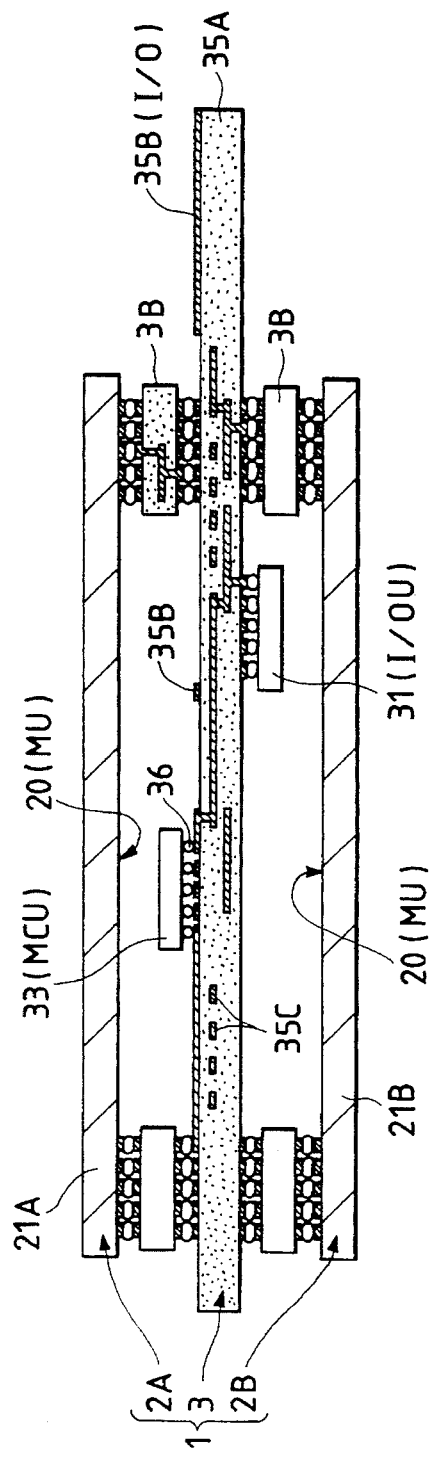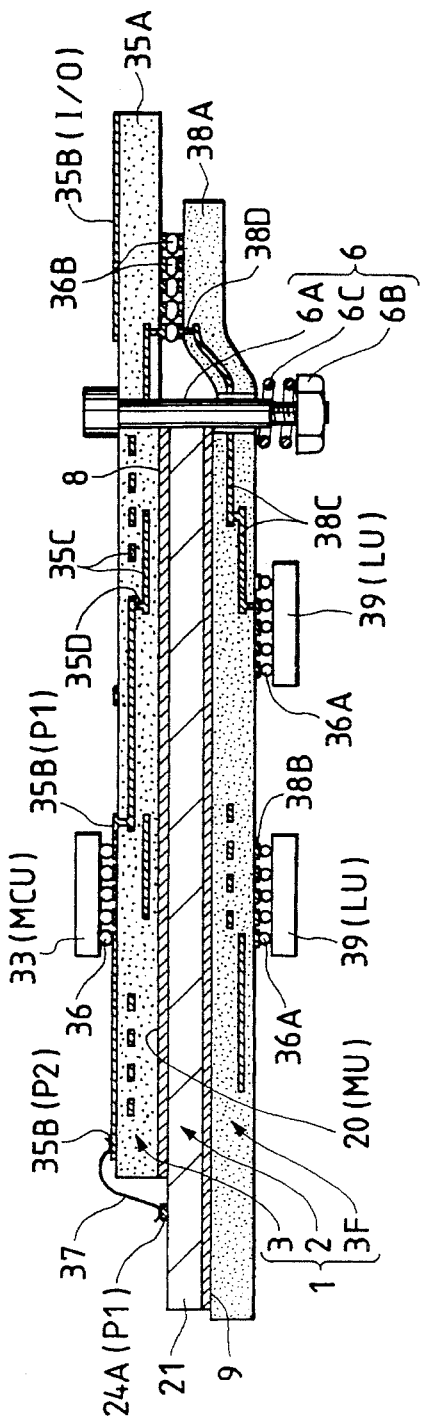

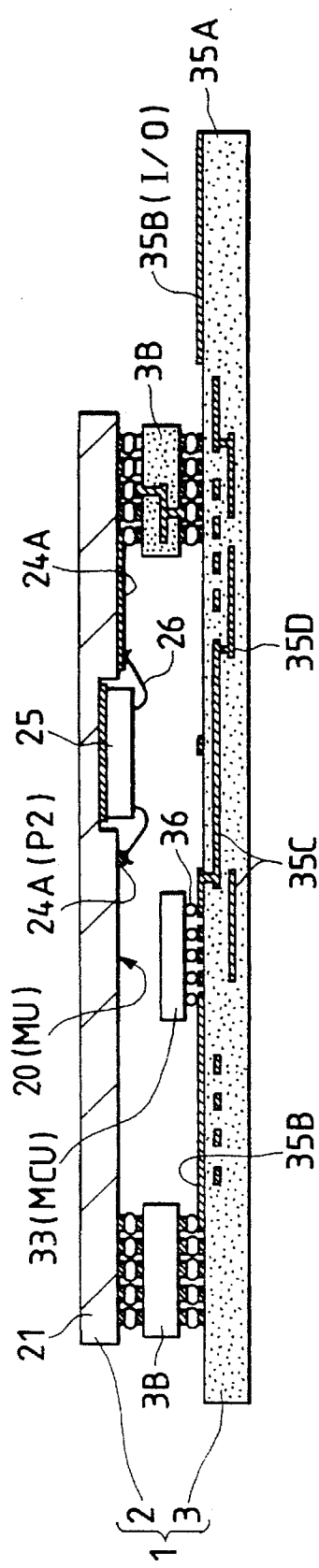
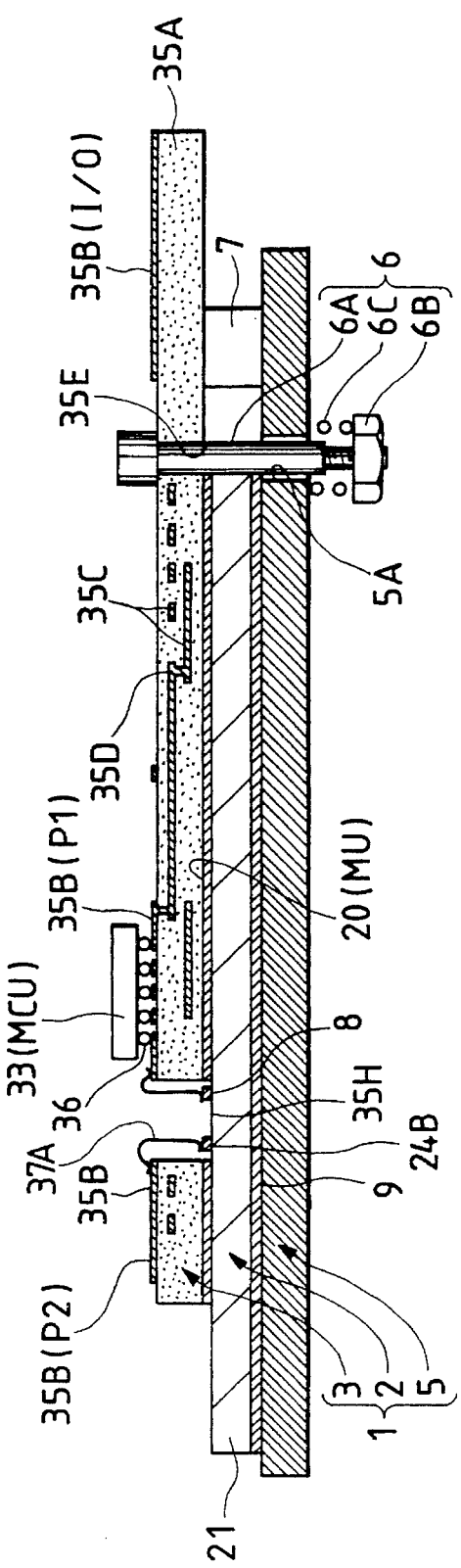

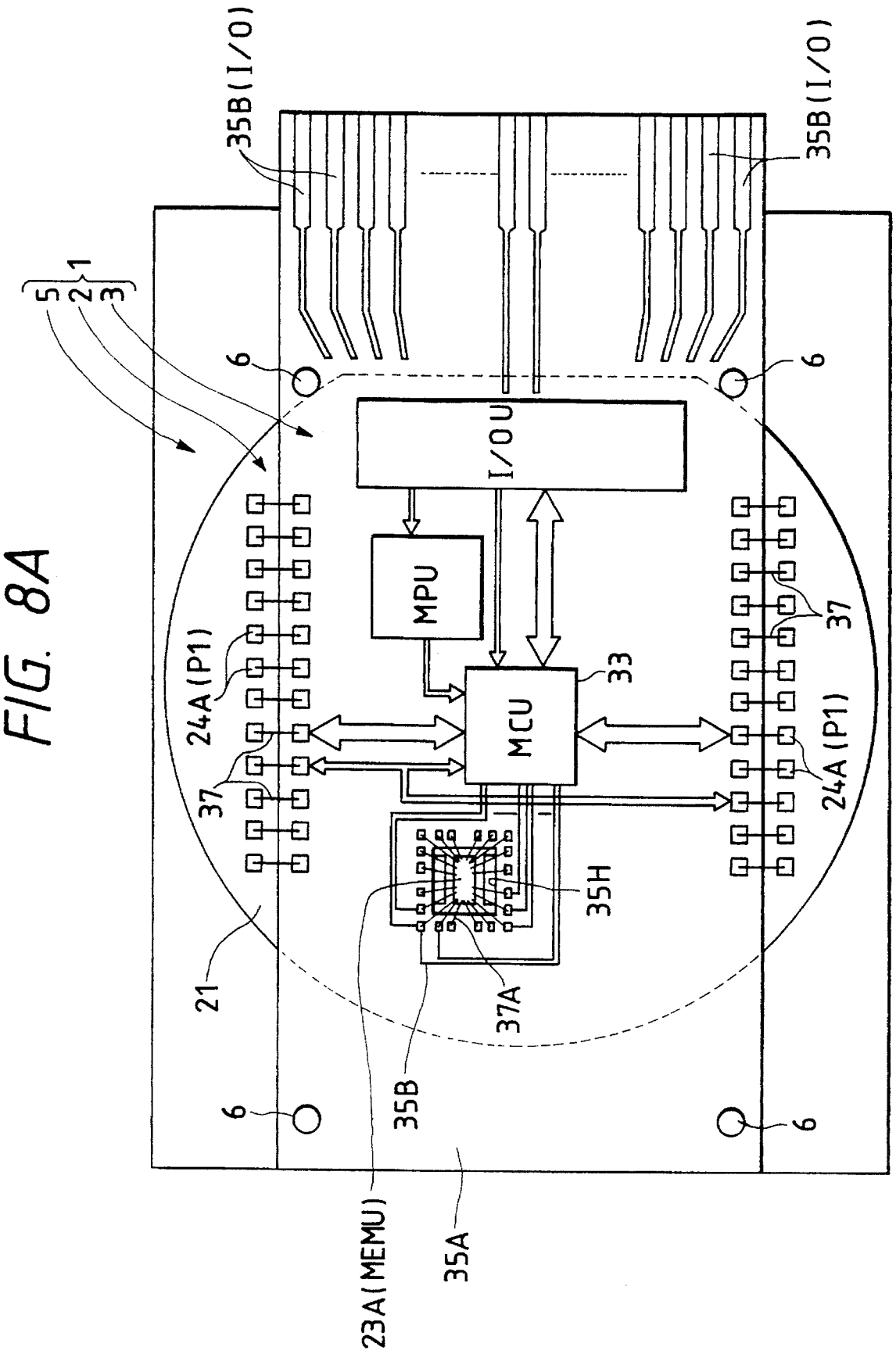

ELECTRONIC CIRCUIT SYSTEM UNIT WITH WIRING SUBSTRATE

BACKGROUND OF THE INVENTION

The present invention relates to an electronic circuit system unit. The present invention, in particular, relates to an electronic circuit system unit having a semiconductor integrated circuit unit formed on a wafer scale, in which a plurality of integrated circuit blocks are disposed on a circuit mounting surface of a semiconductor wafer (WSI: Wafer Scale Integration).

There is a tendency to use a semiconductor storage circuit unit formed on a wafer scale (WSM: Wafer Scale Memory) for a memory unit to be used as a main storage unit to be incorporated in computer systems such as personal computers (PC) or workstations (WS). An example semiconductor storage circuit unit formed on a wafer scale is described in U.S. Pat. No. 4,484,215. A semiconductor storage circuit unit formed on a wafer scale has no mechanical parts, it is possible to make the information writing speed or the information reading speed faster as compared to a magnetic disk memory, which has been the commonly used main storage memory unit. Also, a semiconductor storage circuit unit formed on a wafer scale can make the mounting area small when incorporated in a computer system.

In a semiconductor storage circuit unit formed on a wafer scale, a plurality of storage circuit units (each corresponds to a semiconductor pellet) are disposed systematically on a circuit mounting surface of a semiconductor wafer formed with a silicon monocrystal. The storage circuit unit corresponds to one track of a magnetic disk of a magnetic disk memory, and constitutes a memory unit which is able to store information of a specified capacity. In the case of a semiconductor storage circuit unit formed on a wafer scale, a higher mounting density can be obtained as compared to a plurality of semiconductor units (for example, assembled package products, SOP, ZIP, etc.). With the latter, semiconductor pellets having storage circuits corresponding to the above-mentioned storage circuit units are sealed up with a sealing material and mounted on a printed wiring substrate (PCB).

A semiconductor storage circuit unit formed on a wafer scale is mounted on a surface of a printed wiring substrate as a memory unit. A plurality of terminals (bonding pads) are disposed in the peripheral area on a circuit mounting surface of a semiconductor wafer of the wafer scale semiconductor storage circuit unit. The plurality of terminals are electrically connected with wires to a plurality of respective terminals disposed in corresponding positions on a surface of a printed wiring substrate.

A semiconductor storage circuit unit formed on a wafer scale is mounted on an outer peripheral surface of a print wiring substrate, and a plurality of memory driver units are mounted on a surface of the print wiring substrate. Each memory driver unit comprises a semiconductor unit (assembled package product) in which a semiconductor pellet mounted with an integrated circuit corresponding to a circuit mounting surface is sealed in with a sealing material. A wafer scaled memory as such, for example, is disclosed in ISSCC (International Solid-State Circuits Conference), Digest of Technical Papers, 1989, pp. 240–241, 350.

SUMMARY OF THE INVENTION

The present inventor found problems as shown below in the above-mentioned semiconductor storage circuit unit formed on a wafer scale.

(1) In the case of a semiconductor storage circuit unit formed on a wafer scale and mounted on a surface of a print wiring substrate, besides the semiconductor storage circuit unit a plurality of semiconductor units which constitute a plurality of respective memory driver units are mounted. Because of this, the required mounting area on a surface of a print wiring substrate is increased, and thus the semiconductor storage circuit unit formed on a wafer scale becomes large.

(2) In the above-mentioned semiconductor storage circuit unit formed on a wafer scale, terminals disposed on a surface of a printed wiring substrate and respective terminals disposed on a circuit mounting surface of a semiconductor wafer of a semiconductor storage circuit unit formed on a wafer scale are electrically connected to each other with wires. The connection area is formed in spreading from the periphery of the semiconductor wafer to an area along the outer peripheral part of it, so that the mounting area of the print wiring substrate is increased by an area corresponding to the connection area. Because of this, a semiconductor storage circuit unit formed on a wafer scale becomes large.

(3) For solving the above-mentioned problems, it is considered that the technology to mount other integrated circuit blocks such as memory driver units besides storage circuit units on a circuit mounting surface of a semiconductor wafer is effective. At present, in a lithographic technique (exposure technique) for the transcription of a circuit block onto a circuit mounting surface of a semiconductor wafer, it is common practice to use a reduction projection exposure device being suitable for a minute process and to employ a step and repeat method. In the case of an equimultiple projection exposure device, since the size of a semiconductor wafer and that of a photomask (reticle) are almost the same, the matching error between the photomasks of respective transcription processes in a plurality of times of transcription becomes large, so that the device is not suitable for a minute process. In other words, the device is not suitable to the processing of a semiconductor storage circuit unit formed on a wafer scale. In the case of the above-mentioned reduction projection exposure device, at present, the range of about 20 mm in diameter is the limit of an area in which effective reduction projection transcription can be performed, and a pattern only in the range of the effective transcription area can be transcribed at a time, so that the other integrated circuit blocks such as a storage circuit unit, a memory unit, or a memory driver unit cannot be transcribed at a time. It remarkably degrades the yield in a production process to separately reduce the storage circuit unit and the other integrated circuit blocks and connect them after that, in making the matching error between photomasks large. Because of this, it is technically difficult to mount a plurality of circuit blocks of different functions simultaneously on a circuit mounting surface of a semiconductor wafer; therefore, it is possible to mount only circuit blocks of a single function such as to dispose storage circuit units to be the basic units of repetition.

The objects of the present invention are shown below. (1) An object of the present invention is the miniaturization of a unit in an electronic circuit system unit.

(2) Another object of the present invention is the improvement of the mechanical strength of a unit in an electronic circuit system unit.

(3) A further object of the present invention is a unit of multi-terminals in an electronic circuit system unit.

(4) Yet another object of the present invention is to improve the mounting density in an electronic circuit system unit.

(5) A still further object of the present invention is to improve the heat radiation efficiency in an electronic circuit system unit.

(6) An additional object of the present invention is to improve the reliability in circuit operation in an electronic circuit system unit.

The above-mentioned objects and further objects, and additional features will be made clear by the description in the present specification and the attached drawings.

The outlines of several among the inventions disclosed in the present application will be explained briefly in the following.

(1) In an electronic circuit system unit, a semiconductor wafer, on which a plurality of integrated circuit blocks, basic units being disposed repeatedly on a circuit mounting surface, and an insulating circuit substrate having a wiring layer on at least one surface, are placed to overlap each other in a manner that their thickness directions coincide with each other. And a semiconductor pellet mounted with an integrated circuit to be connected to at least one of a plurality of integrated circuit blocks disposed on the semiconductor wafer is mounted on a circuit mounting surface of the wiring substrate in the area where the wiring substrate and the semiconductor wafer are placed to overlap each other.

(2) In an electronic circuit system unit described as means (1), a circuit mounting surface of a semiconductor wafer and a wiring substrate are placed to overlap each other such that the circuit mounting surface is facing the back side surface opposing to a surface of the wiring substrate, and a part of the periphery of the semiconductor wafer protrudes from the periphery of the wiring substrate being overlapped with the semiconductor wafer, and in a part of the protruded part the respective terminals disposed on the circuit mounting surface of the semiconductor wafer and the respective terminals disposed on a surface of the wiring substrate are electrically connected to each other through wires.

(3) In an electronic circuit system unit described as means (2), the terminals disposed on the circuit mounting surface of the semiconductor wafer are positioned at least in two places, which are: a part of the periphery of the semiconductor wafer, and an area isolated from the part by an area where there is no terminal.

(4) In an electronic circuit system unit described as means (3), the semiconductor wafer is formed substantially in a disk shape and the wiring substrate is formed in a rectangular shape having short sides shorter than the diameter of the semiconductor wafer.

(5) In an electronic circuit system unit described as means (1), the semiconductor wafer and the wiring substrate are placed to overlap each other in a state where the circuit mounting surface of the semiconductor wafer and a surface of the wiring substrate are facing each other, and the terminals disposed on a circuit mounting surface of the semiconductor wafer and the terminals disposed on a surface of the wiring substrate are electrically connected to each other through protruded electrodes.

(6) In an electronic circuit system unit described as means (1), the wiring substrate is formed with a flexible insulating substrate having a wiring layer at least on one surface, and the terminals disposed in the central part on the surface of the wiring substrate and the terminals of the semiconductor pellet are electrically connected to each other through protruded electrodes, and the semiconductor pellet is mounted in the central part of the surface of the wiring substrate, and the terminals disposed in the peripheral part outside the mounted position of the semiconductor pellet on the surface of the wiring substrate are electrically connected to protruded electrodes by the thermocompression bonding method.

(7) In an electronic circuit system unit described as means (1), a reinforcing plate is placed directly, or indirectly, through an elastic body, on the back surface opposing to the circuit mounting surface of the semiconductor wafer on or under which the wiring substrate is to be placed.

(8) In an electronic circuit system unit described means (7), the reinforcing plate is formed with a heat conductive material.

(9) In an electronic circuit system unit described as means (1), an opening is formed in a part of the wiring substrate, the part being in the area where the integrated circuit blocks are disposed on the circuit mounting surface of the semiconductor wafer, and the specified integrated circuit blocks of the semiconductor wafer and the integrated circuits mounted on the circuit mounting surface of the semiconductor pellet mounted on a surface of the wiring substrate are electrically connected to each other through the opening on the wiring substrate.

(10) In an electronic circuit system unit among those described as means out of (1) to (9), a sheet of semiconductor wafer and a plurality of wiring substrates, or a sheet of wiring substrate and a plurality of semiconductor wafers, are placed to overlap each other.

According to means (1), the following effects can be obtained.

(A) In a unit as mentioned in the above, the occupying area of the semiconductor wafer and the occupying area of the semiconductor pellet mounted on the wiring substrate are partly overlapped with each other, and at least a part of the occupying area of either one can be taken into the occupying area of the other one; thereby, in comparison with the case where a semiconductor wafer and a semiconductor pellet are mounted on the wiring substrate, the size of the wiring substrate can be decreased, which contributes to the miniaturization of an electronic circuit system unit. When the electronic circuit system unit is assembled into a system as a unit, the miniaturization of the electronic circuit system unit can increase the mounting density of units to be incorporated into the system.

(B) In a unit as mentioned in the above, a semiconductor wafer and a wiring substrate are placed to overlap each other, which improves the mechanical strength of the semiconductor wafer; thereby, bending, breakage, etc. of a semiconductor wafer can be prevented and the mechanical failure resistance of an electronic circuit system unit can be improved.

According to the means (2) besides the above-mentioned effects obtained by means (1), the electric connection area of the terminals disposed on the circuit mounting surface of a semiconductor wafer and the terminals disposed on the surface of a wiring substrate can be placed to overlap the occupying area of the semiconductor wafer, so that the size of an electronic circuit system unit can be decreased by the area corresponding to the connection area.

According to the above-mentioned means (3), besides the above-mentioned effect obtained by means (2), the number of terminals to be disposed on the circuit mounting surface of a semiconductor wafer and the number of terminals to be disposed on a surface of a wiring substrate can be both increased. (A multi-terminaled unit can be contrived.)

According to the means (4), an effect which is substantially the same as that obtained by means (3) can be obtained.

According to the means (5) besides the effects attained by means (1), the electric connection area of terminals to be disposed on the circuit mounting surface of a semiconductor wafer and terminals to be disposed on the surface of a wiring substrate can be placed to overlap the occupying area of a semiconductor wafer, so that the size of an electronic circuit system unit can be decreased by an area corresponding to the connection area.

According to the means (6), a connection area for making electric connection to a semiconductor wafer, other wiring substrates, etc. based on a thermocompression bonding method is not prepared in the central area on a surface of the flexible wiring substrate is not needed to consider, so that there is no need to secure an area for avoiding the abutment against a thermocompression bonding tool; thereby the number of semiconductor pellets mountable in the central area on the surface of the wiring substrate can be increased.

According to the means (7), the mechanical strength of a semiconductor wafer can be improved with a reinforcing plate, so that bending, breaking, etc. of a semiconductor wafer can be prevented, and the mechanical strength of an electronic circuit system unit can be improved.

According to the means (8), the heat generated by the operation of integrated circuit blocks disposed on the circuit mounting surface of a semiconductor wafer can be radiated through the reinforcing plate, so that the heat radiating efficiency of an electronic circuit system unit can be improved.

According to the means (9), specified integrated circuit blocks of a semiconductor wafer and integrated circuits of semiconductor pellets mounted on a wiring substrate can be connected electrically with comparatively short wires through the opening on the wiring substrate. The signal transmission speed is thereby accelerated and the operation speed of an electronic circuit system unit can be increased. Also, the probability of the generation of noise in signal lines or power supply lines can be decreased and thus the reliability in the operation of an electronic circuit system unit can be improved.

According to the means (10), besides the effects described for means (1) to (9), the mountable number per unit area of integrated circuit blocks of a semiconductor wafer and that of integrated circuits of a semiconductor pellet can be increased, so that an electronic circuit system unit can be made smaller.

In the following, an explanation will be given about the construction and operation of the present invention, and the embodiments in which the present invention is applied to a hard disk memory unit having a semiconductor storage circuit unit in which the memory unit is formed on a wafer scale.

The parts having the same function are given the same symbols in all drawings used for the explanation of embodiments and the duplicated explanation for them is omitted.

BRIEF DESCRIPTION OF THE DRAWINGS

FIG. 5 is a cross-sectional view of a hard disk memory unit in a second embodiment according to the present invention.

FIG. 6 is a cross-sectional view of a hard disk memory unit in a third embodiment according to the present invention.

FIG. 7 is a cross-sectional view of a hard disk memory unit in a fourth embodiment according to the present invention.

FIG. 8A is a plan view of a hard disk memory unit in a fifth embodiment according to the present invention, and FIG. 8B is a cross-sectional view of the essential part of what is shown in FIG. 8A.

DESCRIPTION OF THE PREFERRED EMBODIMENTS

First Embodiment

Figure 4A:
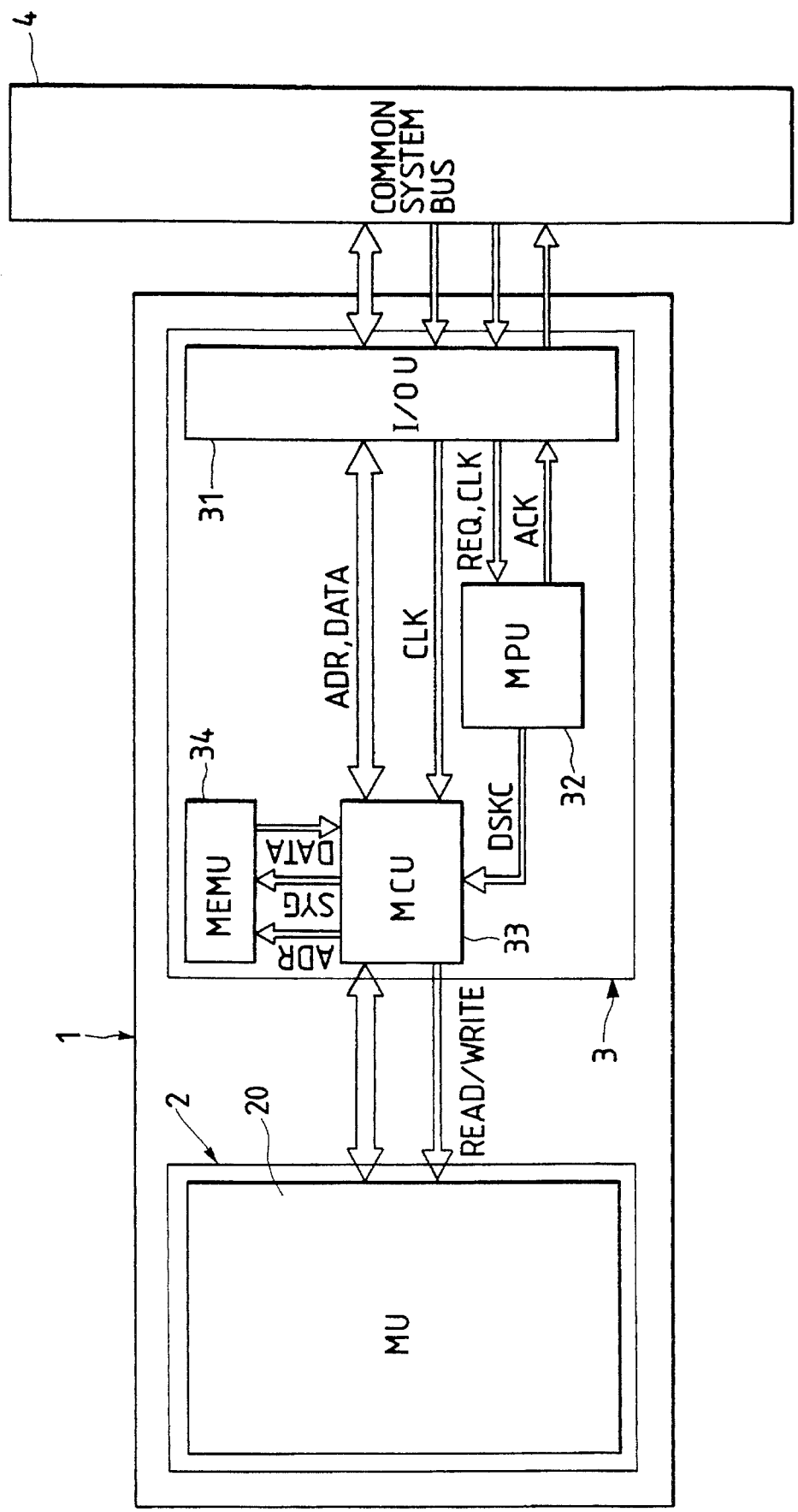
FIG. 4A is a system block diagram of the hard disk memory unit.
Figure 4B:
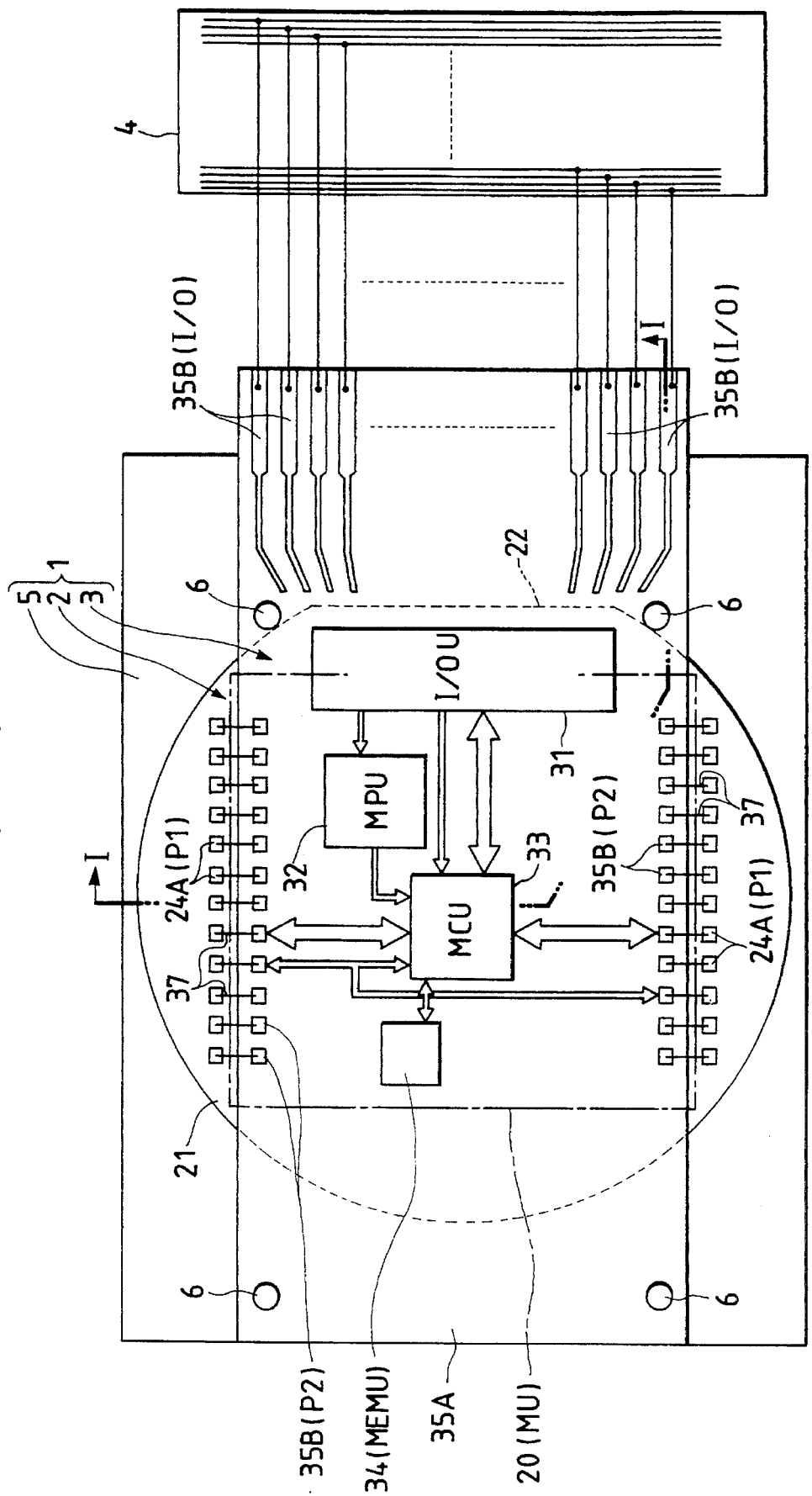
FIG. 4B is a plan view of the outline of what is shown in FIG. 4A.

The system composing a hard disk memory unit (an electronic circuit system unit) according to the first embodiment of the present invention is shown in FIG. 4A (system circuit block diagram) and in FIG. 4B (plan view of the outline of what is shown in FIG. 4A).

A hard disk memory unit I shown in FIG. 4A is to be incorporated in a computer system, such as a personal computer or a workstation, as a main memory unit. The hard disk memory unit 1 comprises the following as main units: an input/output buffer unit (I/O U) 31, a microprocessor unit (MPU) 32, a memory controller unit (MCU) 33, a buffer memory unit (MEMU) 34 and a memory unit (M U) 20.

The hard disk memory unit 1 is connected to the computer system through a common system bus 4. The microprocessor unit 32 of the hard disk memory unit 1 is connected to the common system bus 4 through the I/O buffer unit 31. A request signal REQ and a clock signal CLK are input from the common system bus 4 to the microprocessor unit 32, and an acknowledge signal ACK is output from the microprocessor unit 32 to the common system bus 4.

The microprocessor unit 32 controls the hard disk memory unit 1. The microprocessor unit 32 outputs a disk controller signal DSKC to the memory controller unit 33 for controlling the operation of the memory controller unit 33. The I memory controller unit 33 inputs a clock signal CLK, an address signal ADR, a data signal DATA, etc. from the common system bus 4 based on the disk controller signal DSKC and outputs a data read signal or a data write signal READ/WRITE together with the abovementioned signals to the memory unit 20. The memory controller unit 33 outputs from the memory unit 20 a specified data signal DATA to the common system bus 4.

A buffer memory unit 34, which is a small capacity memory, is connected to the memory controller unit 33. An address signal ADR and a memory clock signal SYG are input to the buffer memory unit 34 from the memory controller unit 33, and the data signal DATA is output from the buffer memory unit 34 to the memory controller unit 33. The buffer memory unit 34 is incorporated in a system in the present embodiment, but it is not an indispensable unit. The buffer memory unit 34 can be replaced, for example, with a cash memory unit.

The memory unit 20, although not limited to such, is for the present embodiment, an EEPROM (electrically erasable programmable read-only memory) of a capacity of 64 Mbyte.

Next, a brief explanation will be given about the construction and operation of a hard disk memory unit 1, using FIG. 1 (a plan view), FIG. 2 (a plan view of the memory unit), FIG. 3 (a sectional view taken on the line, 1—1 in FIG. 1), and FIG. 4B.

Figure 1:
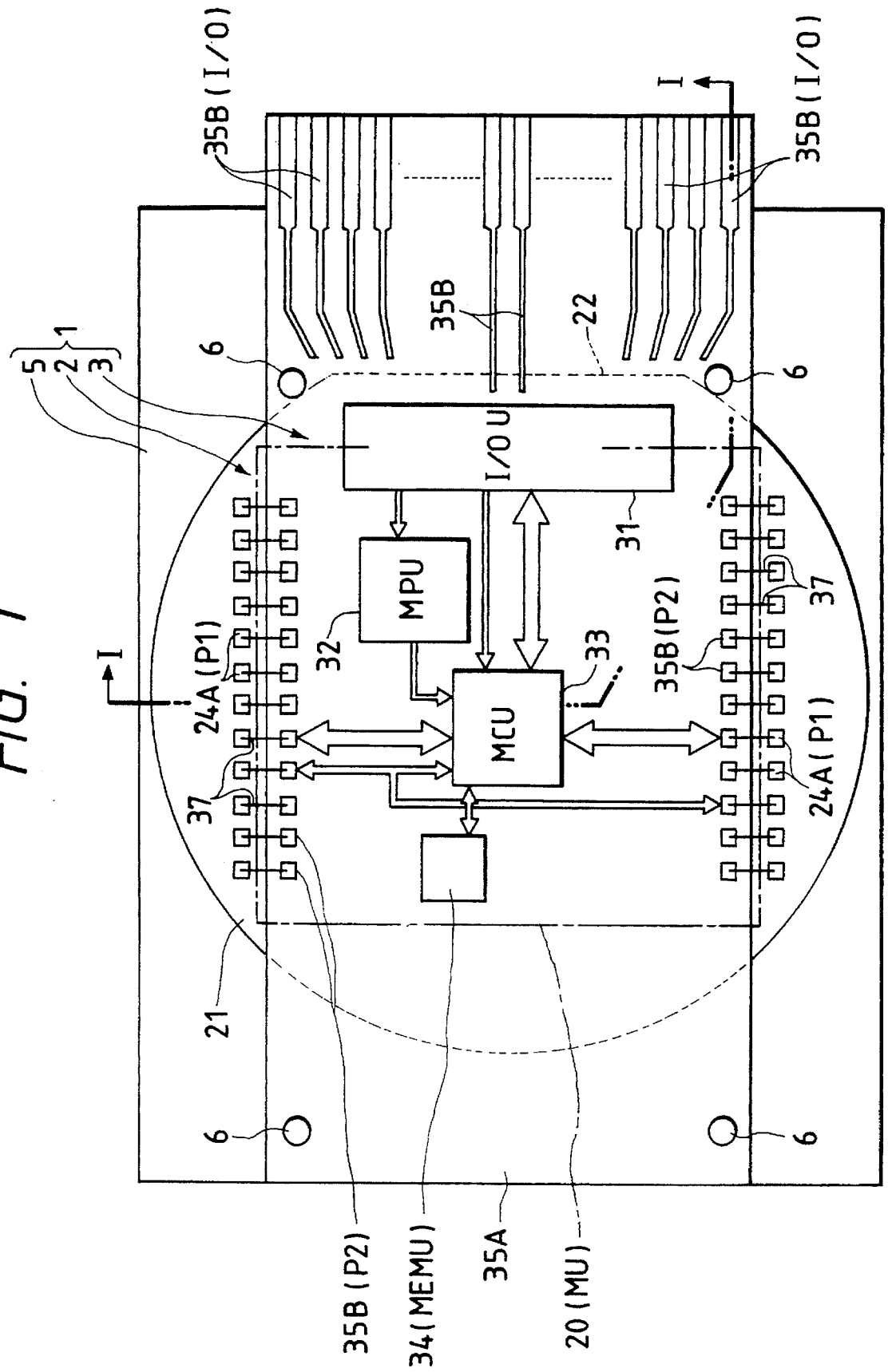
FIG. 1 is a plan view of a hard disk memory unit in a first embodiment according to the present invention.
Figure 3:
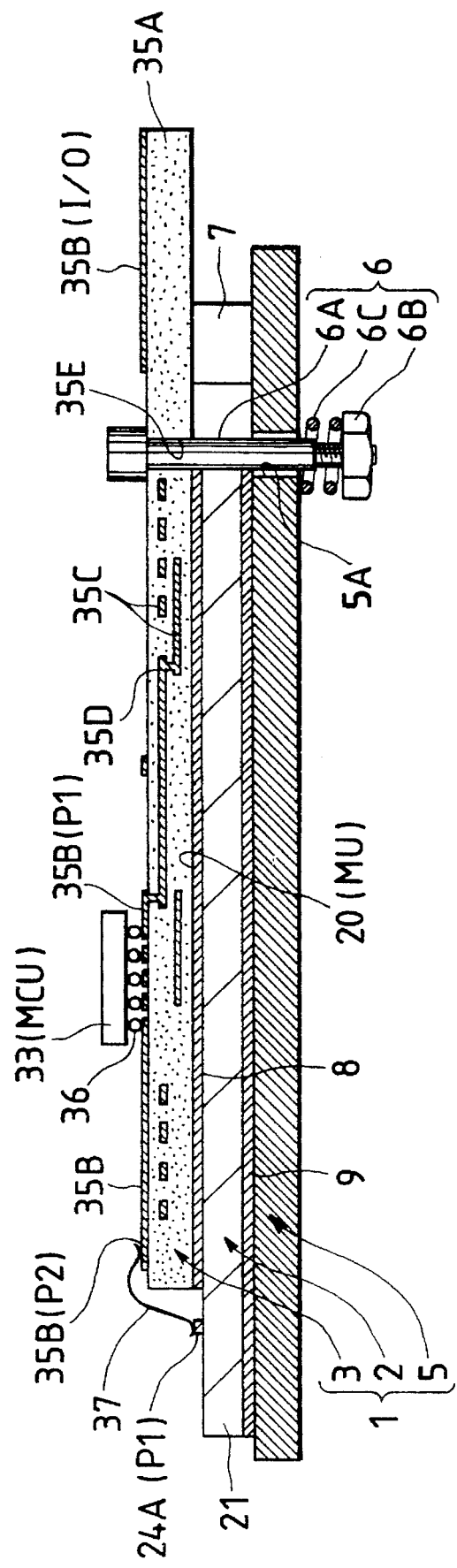
FIG. 3 is a cross-sectional view of the hard disk memory unit.

The hard disk memory unit 1, as shown in FIG. 1 and FIG. 3, basically comprises a semiconductor storage circuit unit (WSI) 2 formed on a wafer scale and a printed wiring substrate (PCB) 3 placed to overlap each other.

Figure 2:
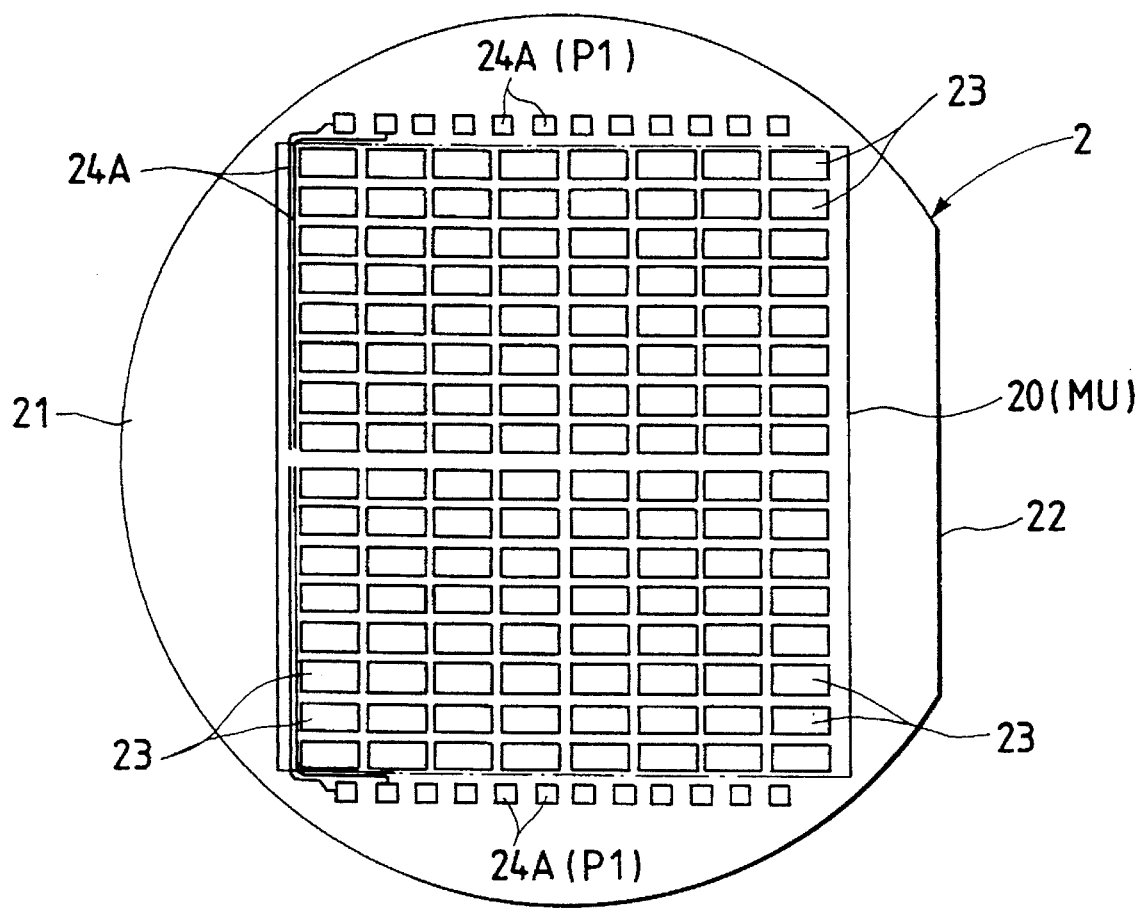
FIG. 2 is a plan view of the semiconductor wafer of the above-mentioned hard disk memory unit.

In the case of a semiconductor storage circuit unit 2 of the hard disk memory unit 1, the memory unit 20 is mounted on a circuit mounting surface (in FIG. 3, upper side surface) of a semiconductor wafer 21 formed with a silicon monocrystal as shown in FIG. 1 to FIG. 3. The semiconductor wafer 21 is formed into a disk shape similar to a shape when an ingot is sliced along a plane intersecting with a pull up axis, and in a part of a peripheral area a plane direction specifying piece 22 is formed. In the present embodiment, the plane direction piece 22 is formed with an orientation flat.

The memory block 20 mounted on the circuit mounting surface of the semiconductor wafer 21, being positioned in the central area of the circuit mounting surface as shown in FIG. 2, has a constitution in which a plurality of storage circuit units 23 are disposed in a queue, which are to be basic units being disposed repeatedly (A unit corresponds to a piece of semiconductor pellet.). A storage circuit unit or piece 23 is, in the present embodiment, composed of an electrically erasable EEPROM having a capacity of 4 Mbits. Eight storage circuit units 23 are disposed in the lateral direction and in the longitudinal direction there are disposed eight pieces on the upper side and eight pieces on the lower side, and in total 128 pieces of units 23 are disposed. In other words, the memory block 20 comprises storage units 23 having an aggregate capacity of 64 Mbytes.

The signals to be supplied to the semiconductor wafer 21, which are the signals to be used in the memory block 20, are the following: a chip enable signal CE (a selection signal of a storage circuit unit 23); an output enable signal OE; a programming enable signal PGM (a data write control signal); an eraser enable signal EE (a data erase signal); address signals $A_0$ to $A_{18}$; and input/output signals $I/O_0$ to $I/O_7$ (data input/output signals). Power supply voltages to be used in the memory block 20 are as follows: a power supply voltage Vcc; an information write voltage/an information erase voltage Vpp; and a reference voltage Vss.

On the semiconductor wafer 21, as shown in FIG. 2, a plurality of terminals 24A (P1) (bonding pad) are disposed in approximately straight lines along the upper side and the lower side respectively of the memory block 20. These terminals 24A are used for inputting or outputting the above-mentioned signals and also for inputting the power supply voltages both inside and outside the semiconductor wafer 21.

In the memory block 20, as shown in FIG. 2, 64 pieces of storage circuit units 23 disposed on the upper side in the longitudinal direction among the disposed 128 pieces of storage circuit units 23 are controlled by the signals and supply voltages supplied through the terminals 24A disposed on the upper side. In the similar way, the 64 pieces of storage circuit units 23 disposed on the lower side are controlled by the signals and voltages supplied through the terminals 24A disposed on the lower side. In other words, in the memory block 20, the storage circuit units 23 disposed on the upper side and the storage circuit units 23 disposed on the lower side are independently controlled. Further, the memory block 20 is divided into eight divisions in the lateral direction. Therefore, considering the two divisions on upper side and lower side, it is divided into 16 divisions. In the memory block 20, one area out of the 16 division areas can be selected by the chip enable signals $CE_O$ to $CE_{15}$, and further a storage circuit unit 23 in the selected one area out of 16 divisions can be selected by the chip enable signals $CE_O$ to $CE_2$. A storage circuit unit 23 is operated corresponding to one track of a magnetic disk, and a piece of storage circuit unit 23 corresponds to a sector of a magnetic disk, and the operation of read and write of information (of 512 bits, for example) can be operated continuously.

The terminals 24A (P1), signal wirings 24A and power supply wirings 24A disposed on a circuit mounting surface of a semiconductor wafer 21 are respectively composed of Al alloy lines of a single layer or a laminated layer with a single layer as the main part.

In FIG. 2, there are shown on the circuit mounting surface of the semiconductor wafer 21, only storage circuit units 23, terminals 24A and wirings 24A constituting the memory block 20; however, actually around the memory block 20, for example, power supply circuits or ECL (Emitter Coupled Logic) circuits as input/output circuits are mounted.

The print wiring substrate 3 comprises, as shown in FIG. 1 and FIG. 3, mainly an insulating substrate 35A, a plurality of wiring layers, and connecting hole wirings 35D. The insulating substrate 35A has a proper hardness keeping insulating characteristic and is formed with a kind of epoxy resin, for example. A wiring layer 35B is formed on the pellet mounting surface of the insulating substrate 35A (the upper surface in FIG. 3), and an internal wiring layer 35C is formed inside the insulating substrate 35A. The wiring layer 35B and the internal wiring layer 35C are respectively formed with a single layer of Cu or a laminated layer with a single layer as the main body, and the wiring layer 35B and the internal wiring layer 35C are electrically connected through the connecting hole wirings 35D.

A plurality of semiconductor pellets 31, 32, 33 and 34 are mounted on the pellet mounting surface of the print wiring substrate 3 as shown in FIG. 1, FIG. 3 and FIG. 4B. The input/output buffer unit 31 is mounted on the circuit mounting surface of the semiconductor pellet 31. In a similar way, the microprocessor unit 32 is mounted on the circuit mounting surface of the semiconductor pellet 32; the memory controller unit 33 is mounted on the circuit mounting surface of the semiconductor pellet 33; and the buffer memory block 34 is mounted on the circuit mounting surface of the semiconductor pellet 34.

Integrated circuits are formed on the respective circuit mounting surfaces of the semiconductor pellets 31 to 34. The integrated circuits are formed with MOS (Metal Oxide Semiconductor) transistors, BI-CMOS (Bipolar-Complementary MOS) transistors or bipolar transistors.

Each of the semiconductor pellets 31 to 34 is formed with a silicon monocrystal, for example, and it is formed by cutting out a semiconductor wafer as a pellet (chip) of a square shape. In the case of the present embodiment, each of the semiconductor pellets 31 to 34 is mounted in a bare state without being packaged; in other words, it is mounted in a state of so called bare chip. (In the present invention, even when a chip is coated with a polyimide resin by a dropping method, for example, it can be included in a concept of a bare chip for the purpose of improving reliability.)

Each of the semiconductor pellets 31 to 34 is mounted in a face-down manner, where the circuit mounting surface of the pellet and the pellet mounting surface of the print wiring substrate are facing each other. The mounting of the semiconductor pellets 31 to 34 onto the printed wiring substrate 3 is performed in a way that the terminals disposed on the circuit mounting surfaces of semiconductor pellets 31 to 34 (They are not shown in a drawing; they correspond to bonding pads.) and the terminals 35B (Pj) of the printed wiring substrate 3 are electrically and mechanically connected through protruding electrodes 36 (solder electrodes or CCB (Controlled Collapse Bonding) electrodes). In the present embodiment, the protruding electrodes are formed with a Pb-Sn alloy.

A semiconductor pellet which has CCB electrodes, there is a description in a U.S. Pat. No. 5,027,188, for example. The CCB electrode teaching and other related contents of the U.S. Pat. No. 5,027,188 are hereby incorporated by reference.

In the above-mentioned printed wiring substrate 3, as shown in FIG. 1 and FIG. 3, the back surface being opposed to a pellet mounting surface is placed facing the circuit mounting surface of a semiconductor wafer 21, and as described in the above, the printed wiring substrate 3 and the semiconductor wafer 21 are placed to overlap each other in a state where the thickness directions of them coincide with each other.

The printed wiring substrate 3 has a rectangular plan view, that is, as shown in FIG. 1, it is formed to a rectangle having long sides in the horizontal direction and short sides in the vertical direction. The length of the rectangle of the print wiring substrate 3 is set to be longer than the diameter of a semiconductor wafer 21 which is to be placed to overlap the printed wiring substrate 3 and both short sides are set to be protruded from the outer periphery of the semiconductor wafer 21.

The width of the rectangle of the print wiring substrate 3 is set to be shorter than the diameter of the semiconductor wafer 21 which is to be placed to overlap the printed wiring substrate 3 and the long sides in the horizontal direction of the printed wiring substrate 3 are positioned inside the outer periphery of the semiconductor wafer 21. In other words, as shown in FIG. 1, the upper part and the lower part of the outer periphery of the semiconductor wafer 21 are protruded outside the long sides on the upper side and on the lower side of the rectangle of the printed wiring substrate 3. To be more precise, in the present embodiment, the width of the rectangle of the printed wiring substrate 3 is set to be shorter than the distance between the terminals 24A (PI) disposed on the upper side and the terminals 24A (P1) disposed on the lower side of the circuit mounting surface of the semiconductor wafer 21.

In the peripheral area of the pellet mounting surface along the upper long side of the rectangle of the printed wiring substrate 3, a plurality of terminals 35B (P2) are disposed in the corresponding positions of the terminals 24A (PI) disposed on the upper side of the circuit mounting surface of the semiconductor wafer 21. In a similar way, a plurality of terminals 35B (P2) are disposed in the corresponding positions of the terminals 24A (P1) disposed on the lower side of the circuit mounting surface of the semiconductor wafer 21 in the peripheral area of the pellet mounting surface along the lower long side of the rectangle of the printed wiring substrate 3. The terminals 35B (P2) of the print wiring substrate 3 and the terminals 24A (P1) of the semiconductor wafer 21 are electrically connected through wires 37. Au wires, for example, are used for the wires 37, and they are bonded by a bonding method using a thermocompression bonding method combined with a supersonic vibration method, for example.

As shown in FIG. 1 and FIG. 4B, a plurality of input/output terminals 35B (I/O connector terminal) are disposed in the peripheral area of the pellet mounting surface along the short side on the right of the rectangle of the printed wiring substrate 3 for the purpose of electrically connecting to the common system bus. The input/output terminals 35B are electrically connected to a plurality of semiconductor pellets 31 to 34 respectively mounted on the pellet mounting surface of the printed wiring substrate 3 through either the wiring layer 35B or the internal wiring layer 35C. The input/output terminals 35B are electrically connected to the terminals 24A of the semiconductor wafer 21 through the terminals 35B of the printed wiring substrate 3 and the wires 37.

As shown in FIG. 1, among the semiconductor pellets 31 to 34 mounted on the print substrate 3, the semiconductor pellet 33, with a circuit mounting surface on which the memory controller unit (MCU) 33 is mounted, is mounted in the central part in the longitudinal direction of the wiring substrate. As described in the above, among the 128 pieces of storage circuit units 23 of the semiconductor storage circuit unit 2 formed on a wafer scale, 64 pieces on the upper side and the 64 pieces on the lower side can be independently controlled, and since the semiconductor pellet 33 is mounted in the central position, the wiring lengths from the memory controller unit 33 to respective storage circuit units 23 can be made uniform. In other words, the wiring lengths from the memory controller unit 33 to the storage circuit units 23, to be concrete, the wiring lengths of the clock signal wiring, the address signal wiring, the data signal wiring, etc. are made uniform, which makes it possible to speed up the circuit operation speed of a hard disk memory unit 1.

In the case where the printed wiring substrate 3 comprises a plurality of wiring layers, not shown in a drawing, there can be found sufficient room in the layout of wirings; thereby, the power supply wirings for respective semiconductor pellets 31 to 34 or the power supply wirings for storage circuit units 23 mounted on the semiconductor wafer 21 can be prepared. In FIG. 1, for example, in the wiring substrate 3 a plurality of power supply wirings can be arranged in a lateral direction each of them extending in a longitudinal In other words, the power supply wirings can be arranged in a stripe pattern.

The printed wiring substrate 3 and the semiconductor wafer 21 are placed to overlap each other through a gap member 8, as shown in FIG. 3, for the basic purpose of protecting storage circuit units 23, and semiconductor elements composing them, which are mounted on the circuit mounting surface of the semiconductor wafer 21 from external stress. The gap member 8 is formed with an insulating material having elasticity, such as a sponge or region film of polyimide, for example. In FIG. 3, adhesive layers can be arranged as a gap member, at least, on the upper surface layer of the wiring substrate 3 and on the lower surface of the circuit mounting surface of the semiconductor wafer 21. In some cases, a polyimide resin film is coated on the circuit mounting surface of the semiconductor wafer 21, as a final protective film for protection against external stress and also for the purpose of improvement of soft error resisting pressure in the storage circuit units The final protective film can be used as a gap member, or a gap member can be arranged separately from the final protective film as shown in the present embodiment.

A reinforcing plate 5 (supporting plate) is fixed on the back surface of the semiconductor storage circuit unit 2 formed on a wafer scale, that is, on the back surface opposing to the circuit mounting surface of the semiconductor wafer 21. The reinforcing plate 5 is basically for the reinforcement of the mechanical strength of the semiconductor wafer and is fixed on the back of the semiconductor wafer 21 through a gap member 9. Also, the reinforcing plate 5 can be formed for the purpose of heat radiation, or for both mechanical reinforcement and heat radiation. When the purpose of the reinforcing plate 5 is a simple reinforcement, it is formed with a conductive plate, for example, a Cu plate, Al plate, or the like, or with an insulating plate, such as an epoxy resin plate, a ceramic plate, an SIC plate, or the like. When the purpose of the reinforcing plate 5 is heat radiation, it is formed with a plate of high heat conductivity such as a Cu plate or an Al plate. When the main purpose of the gap member 9 is reinforcement, it is formed with a similar material to that of the gap member 8, and when the main purpose of it is heat radiation, a material having elasticity and also heat conductivity, a heat conductive grease, for example, is used.

The reinforcing plate 5 is formed in a rectangular shape having long sides in lateral direction in the present embodiment as shown in FIG. 1. The width of the rectangle of the reinforcing plate 5 is set to have an area to cover the whole of the back of the semiconductor wafer 21, that is, the width is set to be equal or a little larger than the diameter of the semiconductor wafer 21. The length of the rectangle of the reinforcing plate 5 is set to be larger than the diameter of the semiconductor wafer 21 to be able to cover the whole area of the back of the semiconductor wafer 21 and also for the purpose of making a mechanical connection to the printed wiring substrate 3.

The reinforcing plate 5 is held by a fixing member 6 in the peripheral area of the semiconductor wafer 21 overlapping the printed wiring substrate 3. The fixing member 6, in the present embodiment, uses a bolt-nut bonding system comprising a bolt 6A, a nut 6B and an elastic body (coil spring) 6C. In other words, the fixing member 6 is fixed to the reinforcing plate 5 to the printed wiring substrate 3 by inserting the bolt 6A into a through hole 35E formed on the wiring substrate 3 and a through hole 5A formed on the reinforcing plate 5 and fastening them with the head of the bolt 6A and the nut 6B. A semiconductor wafer 21 is fixed between the wiring substrate 3 and the reinforcing plate 5. An elastic body 6C is interposed between the bolt 6A and the nut 6B, which decreases the impact of external stress to be applied to the wiring substrate 3, the semiconductor wafer 21 and the reinforcing plate 5.

The gap member 7 is fixed between the print wiring substrate 3 and the reinforcing plate 5 in an area protruding from the periphery of the semiconductor wafer 21 when they are fastened with the fixing member 6. The gap member 7 is able to decrease the impact of external stress applied to the print wiring substrate 3 and the reinforcing plate 5.

As described in the above, according to a hard disk memory unit 1 of the present embodiment, the following effects can be obtained.

(1) In the hard disk memory unit 1, a semiconductor wafer 21 (a semiconductor storage circuit unit 2 formed on a wafer scale), on which a plurality of storage circuit units 23, i.e. the basic units, which are disposed repeatedly on the circuit mounting surface and a print wiring substrate 3 having a wiring layer 35B at least on a surface of an insulating substrate 35A, are placed to overlap each other such that respective thickness directions coincide with each other, and semiconductor pellets 31 to 34, on which integrating circuits (units) electrically connected to at least one of a plurality of the storage circuit units 23 disposed on the semiconductor wafer, are mounted on the circuit mounting surface of the printed wiring substrate 3 in the area in which the wiring substrate 3 and the semiconductor wafer 21 are placed to overlap each other. Owing to such a construction, the following is achieved: (A) The occupying area of the semiconductor wafer 21 (semiconductor storage circuit unit 2) and the occupying area of semiconductor pellets 31 to 34 mounted on the wiring substrate 3 overlap each other and at least a part of one's occupying area can be taken into the other's occupying area, so that in comparison with the semiconductor wafer 21 and the semiconductor pellets 31 to 34 being mounted on the print wiring substrate 3, the size of the wiring substrate 3 can be. This makes it possible to miniaturize a hard disk memory unit 1. The miniaturization of a hard disk memory unit 1 can improve the mounting density of parts when the hard disk memory unit 1 is incorporated into a computer system as a unit. (B) The semiconductor wafer 21 and the wiring substrate 3 are laid to overlap each other, and the mechanical strength of the semiconductor wafer 21 is reinforced with the print wiring substrate 3, so that the bending or breakage of the semiconductor wafer 21 can be prevented, which improves the mechanical strength of a hard disk memory unit 1.

(2) In the hard disk memory unit 1, a semiconductor wafer 21 and the print wiring substrate 3 are laid to overlap each other in a state where the circuit mounting surface of the semiconductor wafer 21 and the back surface opposing to a surface of the print wiring substrate 3 are facing each other, and an area of the periphery of the semiconductor wafer 21 protrudes from the periphery of the print wiring substrate 3 placed to overlap the semiconductor wafer. In the protruding area, the terminals 24A (P1) disposed on the circuit mounting surface of the semiconductor wafer 21 and the terminals 35B (P2) disposed on a surface of the print wiring substrate 3 are electrically connected to each other through the wires 37. Owing to this construction, the occupying area of the semiconductor wafer 21 and the electric connection area of the terminals 24A (P1) disposed on the circuit mounting surface of the semiconductor wafer 21 and the terminals 35B (P2) disposed on the surface of the print wiring substrate 3 can overlap each. Thus, in addition to the effect described in the means (1), the size of a hard disk memory unit 1 can be decreased by the area corresponding to the connection area.

(3) In a hard disk memory unit 1, the terminals 24A (P1) disposed on the circuit mounting surface of the semiconductor wafer 21 are placed at least in two places, that is, in an area being a part of the periphery of the semiconductor wafer 21 and in the other area being isolated by the interposition of an area where there is no terminal 24A (PI). Owing to this construction, besides the effect described for the means (1), the number of terminals 24A (P1) to be disposed on the circuit mounting surface of the semiconductor wafer 21 and also the number of terminals 35B (P2) to be disposed on a surface of the substrate 3 can be both increased. Thus, unit of multiterminals can be contrived.

(4) In a hard disk memory unit 1, a semiconductor wafer 21 is formed substantially to a disk shape, and the printed wiring substrate 3 is formed as a rectangle having short sides shorter than the diameter of the semiconductor wafer 21. Thus, an effect substantially the same as that obtained in the means (3) can be obtained.

(5) In a hard disk memory unit 1, a reinforcing plate 5 is placed directly, or indirectly through an elastic body (gap member 9), on the back surface opposing to a circuit mounting surface of a semiconductor wafer 21 which is to overlap the print wiring substrate. As a result, the mechanical strength of the semiconductor wafer 21 is increased with the reinforcing plate 5, so that bending or breakage of the semiconductor-wafer is prevented and the destruction resistance of a hard disk memory unit 1 can be improved.

(6) In a hard disk memory unit 1, a reinforcing plate 5 is formed with a heat conductive material. As a result the heat generated by the operation of storage circuit units 23 disposed on the circuit mounting surface of the semiconductor wafer 21 is radiated through the reinforcing plate 5, to improve the heat radiation efficiency of the hard disk memory unit 1.

Second Embodiment

The second embodiment according to the present invention is as follows: in a hard disk memory unit a print wiring substrate is placed between two sheets of semiconductor wafers. This second embodiment thus changes the constitution of the electric connection of a print wiring substrate to a semiconductor wafer.

In the hard disk memory unit 1 in the present embodiment, as shown in FIG. 5, a sheet of printed wiring substrate 3 is placed between two semiconductor wafers, which are a semiconductor wafer 21A and a semiconductor wafer 21B. In FIG. 5, the semiconductor wafer 21A is placed on top of the wiring substrate 3 and the semiconductor wafer 21B is placed under the wiring substrate 3.

The semiconductor wafers 21A and 21B constitute semiconductor storage circuit units 2A and 2B, respectively, which are formed on wafer scales of the same function. In other words, a memory block (MU) 20 on which a plurality of storage circuit units 23 are disposed is mounted on the circuit mounting surface of the semiconductor wafer 21A, and in a similar way, a memory block 20 on which a plurality of storage circuit units 23 is disposed is mounted on the circuit mounting surface of the semiconductor wafer 21B. The memory block 20 is composed of an electrically erasable EEPROM similar to the first embodiment. In the case of the semiconductor storage circuit units 2A and 2B constituted on two kinds of wafer scales, the storage capacities of the memory blocks 20 can be simply doubled to be 128 Mbytes.

It is also possible to mount units of different functions on the semiconductor wafers 21A and 21B respectively and constitute semiconductor storage circuit units 2A and 2B formed on substantially two kinds of wafer scales. For example, a memory block 20 on which a plurality of storage circuit units 23 are disposed is mounted on the circuit mounting surface of the semiconductor wafer 21A, and a logic unit on which a plurality of logic circuit blocks are disposed is mounted on the circuit mounting surface of the semiconductor wafer 21B.

The semiconductor wafers 21A and 21B of the semiconductor storage circuit units 2A and 2B formed on a wafer scale are electrically and mechanically connected to the printed wiring substrate 3 through a connecting printed wiring substrate 3B. The connecting print wiring substrate 3B has substantially the same constitution as that of the print wiring substrate 3 and the main part of it is composed of an insulating substrate having a plurality of wiring layers. Between the terminals 24A (P1) of semiconductor wafers 2A and 2B, and the terminals of the connection wiring substrate 3B, and between the terminals of the connection printed wiring substrate 3B and the terminals 3B (P2) of the wiring substrate 3 are connected to each other through protruding electrodes (formed with the same material as that of the protruding electrode 36) electrically and mechanically. The connection area is positioned in an area where the semiconductor wafers 21A and 21B, and the wiring substrate 3 overlap each other. A plurality of semiconductor pellets 31 to 34 are mounted on the printed wiring substrate 3, similar to the first embodiment.

As described in the above, following effects can be obtained according to a hard disk memory unit 1 of this second embodiment.

(1) In a hard disk memory unit 1, a semiconductor wafer 21A (or 21B) and the printed wiring substrate 3 are laid to overlap each other in a manner where the circuit mounting surface of the semiconductor wafer 21A (or 21B) and a surface of the wiring substrate 3 are facing each other, and the terminals 24A (P1) disposed on the circuit mounting surface of the semiconductor wafer 21A and the terminals 35B (P2) disposed on a surface of the wiring substrate 3 are electrically connected to eachother through protruding electrodes. As a result of this construction, in addition to the effect described for the first embodiment, the occupying area of the semiconductor wafer 21A and the electric connection area between the terminals 24A disposed on the circuit mounting surface of the semiconductor 21A and the terminals 35B disposed on a surface of the printed wiring substrate 3 can be placed to overlap each other. Thus, the size of a hard disk memory unit 1 can be decreased by an area corresponding to the connection area.

(2) In a hard disk memory unit 1, a plurality of semiconductor wafers 21A and 21B, and a sheet of printed wiring substrate 3 are placed to overlap each other. As a result, in addition to the effect described for the first embodiment, the number of storage circuit units 23 mounted on the semiconductor wafers 21A and 21B per unit area, and the number of integrated circuits (unit) on semiconductor pellets 31 to 34 mounted on the print wiring substrate 3 per unit area can be increased. Thus, the size of a hard disk memory unit 1 can be decreased further.

Third Embodiment

The third embodiment according to the present invention in, is a hard disk memory unit comprising two sheets of printed wiring substrates and a sheet of semiconductor wafer placed to overlap each other. In a hard disk memory unit of the third embodiment one sheet of print wiring substrate is made flexible among the two.

The constitution of a hard disk memory unit in the embodiment 3 will be shown in FIG. 6 (a sectional view).

In a hard disk memory unit 1 in the third embodiment, as shown in FIG. 6, two sheets of wiring substrates 3 and 3F, and one sheet of semiconductor wafer 21 are placed to overlap each other. In FIG. 6, the printed wiring substrate 3 is placed on the upper side of the circuit mounting surface of the semiconductor wafer 21 and the printed wiring substrate 3F is placed on the back of the semiconductor wafer 21. The semiconductor wafer 21 is mounted with memory blocks 20 similar to the case of the first embodiment, and constitutes a semiconductor storage circuit unit 2 formed on a wafer scale. The printed wiring substrate 3, from among the two sheets of wiring substrates 3 and 3F, is mounted with semiconductor pellets 31 to 34 similar to the first embodiment.

The printed wiring substrate 3F sheets of print wiring from among the substrates 3 and 3F, has flexibility in the present embodiment. The substrate 3F is mainly composed of an insulating substrate 38A formed, for example, with a polyimide resin substrate (resin film substrate), and comprises multilayered wiring layers 38B and 38C, similar to the printed wiring substrate 3. The wiring layer 38B and the internal wiring layer 38C are electrically connected to each other through connecting hole wirings 38D.

A semiconductor pellet 39 is mounted on a pellet mounting surface of the printed wiring substrate 3F (in FIG. 6, on the lower side surface) in a face-down system similar to that of the printed wiring substrate 3. In other words, the terminals of the semiconductor pellet 39 (corresponding to bonding pads) and the terminals 38B of the print wiring substrate 3F are electrically and mechanically connected to each other through protruded electrodes 36A. The protruding electrodes 36A can be formed with a Pb - Sn alloy, similar to the protruding electrodes 36 formed between the wiring substrate 3 and the semiconductor pellets 31 through 34 mounted on it. However, in the present third embodiment these are formed with Au or laminated layers composed of mainly Au. In the case of protruding electrodes formed with Au, a thermocompression bonding method is used, for example, and the bonding is performed by proper heating and pressing with a bonding tool. A specified logic integrated circuit is mounted on the circuit mounting surface of the semiconductor pellet 39, and the logic integrated circuit is incorporated into a system of a hard disk memory unit 1 as a logic unit (LU).

The printed wiring substrate 3F, utilizing its flexibility, is bent toward the wiring substrate 3 side in an area where the printed wiring substrate 3F and the substrate 3 overlap each other, which is in the periphery of the semiconductor wafer 21, and it is electrically and mechanically connected to the terminals 38B on the back of the printed wiring substrate 3 through protruding electrodes 36B. The protruding electrodes 36B are formed of Au or a laminated layer mainly composed of Au, and are bonded by the thermocompression method similar to the above-mentioned protruding electrodes 36A. The printed wiring substrate 3F is connected to the substrate 3 after a semiconductor pellet 39 is mounted on the pellet mounting surface of the substrate 3F. Therefore, if a bonding tool is intended to be inserted into the central area of substrate 3F where the semiconductor pellet 39 is mounted, it is necessary to secure an area for preventing the contact between the bonding tool and the semiconductor pellet 39. This degrades the mounting density of parts on the printed wiring substrate. Accordingly, the connection area of the substrate 3F to the substrate 3 is set outside the area where the semiconductor pellet 39 is mounted in order to control the degradation of mounting, density.

As described in the above, according to a hard disk memory unit 1 in the third embodiment following effects can be obtained.

(1) In a hard disk memory unit 1, the printed wiring substrate 3F is formed with a flexible insulating substrate 38A having a wiring layer 38B at least on a surface, and the terminals 38B disposed in a central area of the substrate 3F and the terminals of the semiconductor pellet 39 are electrically connected to each other through electrodes 36A, and the semiconductor pellet 39 is mounted in the central area on the substrate 3F, and the terminals 38B disposed in the peripheral part outside the mounted area of the semiconductor pellet 39 on the substrate 3F are electrically connected to the protruding electrodes 36B based on the thermocompression bonding method. Owing to this construction, there is no need to prepare a connection area in the central area of the flexible wiring substrate 3F for making electrical connections based on the thermocompression bonding method to the other print wiring substrate. Therefore, there is no need to secure an area to avoid the abutment against the bonding tool, and the number of pieces of the semiconductor pellets 39 which can be mounted in the central area of the printed wiring substrate 3F can be increased.

(2) In a hard disk memory unit 1, one sheet of the semiconductor wafer 21 and a plurality of sheets of the printed wiring substrates 3 and 3F are placed to overlap each other. Owing to this construction, similar to the effect described in the second embodiment, further miniaturization of a hard disk memory unit 1 is made possible.

The above-mentioned hard disk memory unit 1 can be constructed such that the semiconductor wafer 21 and the printed wiring substrate 3F are connected with wires, similar to the system in which the printed wiring substrate 3 and the semiconductor wafer 21 are connected with wires 37.

Fourth Embodiment

The fourth embodiment according to the present invention is as follows: In a hard disk memory unit, a semiconductor pellet is mounted on the circuit mounting surface of a semiconductor wafer.

The construction of a hard disk memory unit in the present fourth embodiment is shown in FIG. 7 (a sectional view).

In a hard disk memory unit 1 of this fourth embodiment, as shown in FIG. 7, a semiconductor pellet 25 is mounted in a specified area on the circuit mounting surface of a semiconductor wafer 21 of the semiconductor storage circuit unit 2 formed on a wafer scale. The semiconductor pellet 25 is formed from an ordinary semiconductor wafer by cutting in a dicing method, and is mounted as a bare chip. The semiconductor pellet 25 is first mounted on a characteristics test substrate (for example, a baby board) and after electric tests are performed on the characteristics test substrate, it is taken out by cutting together with the characteristics test substrate and mounted on the semiconductor wafer 21.

When there is a storage circuit unit 23 having an electric failure among a plurality of storage circuit units 23 disposed on the circuit mounting surface of a semiconductor wafer 21, the semiconductor pellet 25 is mounted as a failure relief. In this case, a storage circuit unit 23 which is substantially the same as the storage circuit unit 23 mounted on the semiconductor wafer 21 is mounted on the circuit mounting surface of the semiconductor pellet 25. It is possible that either one of the semiconductor pellets 31 to 34 mounted on the printed wiring substrate 3 is rejected and the semiconductor pellet 25 mounts an integrated circuit corresponding to the rejected semiconductor pellet among the semiconductor pellets 31 to 34, the memory controller unit 33, for example. It is also possible that the semiconductor pellet 25 mounts another logic integrated circuit for the purpose of reinforcing the system function of a hard disk memory unit 1.

The semiconductor pellet 25 is mounted on the circuit mounting surface of the semiconductor wafer 21 in a face-up system, and the terminals of the semiconductor pellet 25 and the terminals of the semiconductor wafer 21 are electrically connected to each other through the wires 26.

As described in the above, according to a hard disk memory unit 1 in the present fourth embodiment, effects similar to the those obtained in the above-mentioned embodiments can be obtained.

Fifth Embodiment

The present fifth embodiment 5 is an embodiment according to the present invention in which operation speed of a hard disk memory unit is expedited.

The constitution of a hard disk memory unit according to the fifth embodiment in the present invention is shown in FIG. 8A (a plan view) and FIG. 8B (a sectional view of the essential part).

In a hard disk memory unit 1 in this fifth embodiment, as shown in FIG. 8A and FIG. 8B, an opening 35H is formed on a specified storage circuit unit 23 mounted on a semiconductor wafer 21 placed to overlap a printed wiring substrate 3. The specified storage circuit unit 23 mounted on the circuit mounting surface of the semiconductor wafer 21 positioned in the area of the opening 35H is used as a memory buffer unit (MEMU) 23A. The memory buffer unit 23A is electrically connected to a memory controller unit 33 on a semiconductor pellet 33 mounted on the substrate 3 through the opening 35H formed on the substrate 3. In other words, the terminals 24B (formed with the some conductive layer as that of a wire 24A) are connected to the memory controller unit 33 of the semiconductor pellet 33 through the wires 37A and the wirings 35B of the wiring substrate 3.

As described in the above, according to the hard disk memory unit 1 shown in the present embodiment, it is possible to obtain the effects below.

In a hard disk memory unit 1, an opening 35H is formed in a part of the substrate 3, the part where the print wiring substrate 3 and the area, where the storage circuit units 23 on the circuit mounting surface of the semiconductor wafer 21 are disposed, and the specified memory buffer unit (MEMU) 23A of the semiconductor wafer 21 and the memory controller unit (MCU) 33 mounted on the circuit mounting surface of the semiconductor pellet 33 mounted on a surface of the substrate 3 overlap each other and the unit 23 and the MEMU 23A are electrically connected to each other through the opening 35H.

Owing to this construction, the specified memory buffer units 23A of the semiconductor wafer 21 and the memory controller units 33 of the semiconductor pellet 21 mounted on the substrate 3 can be electrically connected with short wires through the opening 35H, so that the signal transmission speed is increased and thus the operation speed of a hard disk memory unit 1 can be increased. Also, the probability of generation of noise in signal wirings or power supply wirings can be decreased, so that the reliability in the system operation of a hard disk memory unit 1 can be improved.

The present has been described by the inventor in reference to several example embodiments. The present invention, however, is not limited to the above and it will be understood that various modifications may be made thereto within the true spirit and scope of the invention. For example:

In the present invention, in a hard disk memory unit 1, a semiconductor wafer 21 can be changed to a compound semiconductor wafer.

In the present invention, in a hard disk memory unit 1, a print wiring substrate 3 can be changed to a substrate composed of other materials, such as a ceramic wiring substrate or silicon wiring substrate.

In the present invention, in a hard disk memory unit 1, any one of other memory blocks or logic units such as DRAM (Dynamic Random Access Memory), SRAM (Static Random Access Memory) or ROM (Read only memory) can be mounted on the circuit mounting surface of the semiconductor wafer 21.

The present invention is not limited to a hard disk memory unit, but instead can be applied to a wide range of equipment.

The effects obtained in the representative inventions disclosed in this application will be briefly recounted in the following.

(1) In an electronic circuit system unit, miniaturization of the unit can be achieved.

(2) In an electronic circuit system unit, mechanical strength of the unit can be improved.

(3) In an electronic circuit system unit, a unit of multi-terminals can be achieved.

(4) In an electronic circuit system unit, the mounting density of parts can be improved.

(5) In an electronic circuit system unit, heat radiating efficiency can be improved.

(6) In an electronic circuit system unit, reliability in circuit operation can be improved.

What is claimed is:

1. An electronic circuit system unit comprising;
   a semiconductor wafer having a circuit mounting surface;
   a plurality of integrated circuit blocks formed on said circuit mounting surface, constituting basic units, which are arranged repeatedly on said circuit mounting surface;
   a wiring substrate having a circuit mounting surface, an insulating substrate, a wiring layer formed on said insulating substrate and a back surface;
   a semiconductor pellet mounted on said circuit mounting surface of said wiring substrate in an area where said wiring substrate and said semiconductor wafer overlap having an integrated circuit element formed thereon;
   means for electrically connecting said integrated circuit element to at least one of said integrated circuit blocks, and
   wherein said semiconductor wafer and said wiring substrate are arranged to overlap each other in a state where the circuit mounting surface of said semiconductor wafer and the back surface of said wiring substrate face each other, and wherein an area of the periphery of said semiconductor wafer protrudes from the periphery of said wiring substrate that overlaps said semiconductor wafer, and wherein said means for electrically connecting said integrated circuit element to at least one of said integrated circuit blocks comprises first terminals disposed on the circuit mounting surface of said semiconductor wafer in an area of the protruded area and second terminals disposed on a surface of said wiring substrate and wires electrically connected to said first and second terminals.

2. An electronic circuit system according to claim 1 wherein the first terminals disposed on the circuit mounting surface of said semiconductor wafer are disposed in two areas, one of said two areas being a first portion of the periphery of said semiconductor wafer and the other of said two areas being a second portion of the periphery area isolated from said first portion by an interposed area having no terminal.

3. An electronic circuit system unit according to claim 2 wherein said semiconductor wafer is constituted to have a substantially disk shape, and said wiring substrate is constituted with a rectangular plate having short sides shorter than the diameter of said semiconductor wafer.

4. An electronic circuit system unit according to claim 1, further comprising:
   a reinforcing plate placed on a back surface of said semiconductor wafer opposing to said circuit mounting surface of said semiconductor wafer, said reinforcing plate fixed to said back surface directly or indirectly by an elastic body and arranged to overlap said wiring substrate.

5. An electronic circuit system unit according to claim 4 wherein said reinforcing plate comprises a heat conducting material.

6. An electronic circuit system unit comprising:

a semiconductor wafer having a circuit mounting surface;

a plurality of integrated circuit blocks formed on said circuit mounting surface, constituting basic units, which are arranged in a repeated manner on said circuit mounting surface;

a wiring substrate, arranged to substantially overlap said semiconductor wafer, having a circuit mounting surface, an insulating substrate made of a flexible material, a wiring layer formed on said insulating substrate, and first terminals located in a central portion of said wiring substrate and electrically connected to said wiring layer; and a semiconductor pellet mounted on said central part of said wiring substrate where said wiring substrate and said semiconductor wafer overlap, said semiconductor pellet having a plurality of second terminals;

means for electrically connecting at least one of said first plurality of terminals to at least one of said second plurality of terminals, said means comprising a first protruding electrode;

third terminals, electrically connected to said wiring layer, disposed in a peripheral surface of said wiring substrate outside the mounting position of said semiconductor pellet; and a second protruded electrode connected to at least one of said third terminals by thermocompression bonding.

7. An electronic circuit system unit according to claim 6, further comprising:

a second wiring substrate having an insulating substrate and a wiring layer on said insulating substrate;

a second semiconductor pellet mounted on a circuit mounting surface of said second wiring substrate in an area where said second wiring substrate and said semiconductor wafer overlap each other;

fourth terminals formed on a back surface of said second opposing to said circuit mounting surface of said second wiring substrate, wherein said fourth terminals and said third terminals electrically connected to each other through said second protruded electrodes, and wherein said semiconductor wafer is positioned between said wiring substrate and said second wiring substrate, and said semiconductor wafer has a substantially disk shape, and wherein said second wiring substrate comprises a rectangular plate having short sides shorter than a diameter of said semiconductor wafer and long sides longer than said diameter of said semiconductor wafer.

8. An electronic circuit system unit comprising:

a semiconductor wafer having a circuit mounting surface;

a plurality of integrated circuit blocks formed on said circuit mounting surface, constituting basic units, which are arranged in a repeated manner on said circuit mounting surface;

a wiring substrate having a circuit mounting surface, an insulating substrate, a wiring layer formed on said insulating substrate and a back surface; and a semiconductor pellet, mounted on said circuit mounting surface of said wiring substrate in an area where said wiring substrate and said semiconductor wafer overlap, having an integrated circuit element formed thereon; and means for electrically connecting sid integrated circuit element to at least one of said integrated circuit blocks;

wherein an opening is formed in said wiring substrate in an area where integrated circuit blocks on the circuit mounting surface of said semiconductor wafer are disposed, and at least one of said integrated circuit blocks on the semiconductor wafer and the integrated circuit element mounted on the circuit mounting surface of the semiconductor pellet are electrically connected to each other by wires extending through said opening.

9. An electronic circuit system unit according to claim 8, wherein said semiconductor wafer has a substantially disk shape, and said wiring substrate comprises a rectangular plate having short sides shorter than the diameter of said semiconductor wafer.

10. An electronic circuit system unit according to claim 8, wherein the back surface of said wiring substrate and said circuit mounting surface of said semiconductor wafer face.

11. An electronic circuit system unit comprising:

a semiconductor wafer having a circuit mounting surface;

a plurality of integrated circuit blocks formed on said circuit mounting surface, constituting basic units, which are arranged in a repeated manner on said circuit mounting surface;

a wiring substrate having a circuit mounting surface, an insulating substrate, a wiring layer formed on said insulating substrate and a back surface;

a semiconductor pellet mounted on said circuit mounting surface of said wiring substrate in an area where said wiring substrate and said semiconductor wafer overlap, having an integrated circuit element formed thereon;

means for electrically connecting said integrated circuit element to at least one of said integrated circuit blocks, wherein one sheet of a semiconductor wafer and a plurality of sheets of wiring substrates are placed to overlap each other.

12. An electronic circuit system unit comprising:

a semiconductor wafer having a circuit mounting surface;

a plurality of integrated circuit blocks formed on said circuit mounting surface, constituting basic units, which are arranged in a repeated manner on said circuit mounting surface;

a wiring substrate having a circuit mounting surface, an insulating substrate, and a wiring layer formed on said insulating substrate; and a semiconductor pellet, mounted on said circuit mounting surface of said wiring substrate in an area where said wiring substrate and said semiconductor wafer overlap, having an integrated circuit element formed thereon; and means for electrically connecting said integrated circuit element to at least one of said integrated circuit blocks, wherein a plurality of sheets of semiconductor wafers and one sheet of wiring substrate are placed to overlap each other.

13. An electronic circuit system unit comprising:

a semiconductor wafer having a circuit mounting surface;

a plurality of integrated circuit blocks formed on said circuit mounting surface, constituting basic units, which are arranged in a repeated manner on said circuit mounting surface;

a wiring substrate having a circuit mounting surface, an insulating substrate, a wiring layer formed on said insulating substrate, and a back surface;

a semiconductor pellet, mounted on said circuit mounting surface of said wiring substrate in an area where said wiring substrate and said semiconductor wafer overlap, having an integrated circuit element formed thereon; and means for electrically connecting said integrated circuit element to at least one of said integrated circuit blocks, wherein said semiconductor wafer a substantially disk shape, and said wiring substrate comprises a rectangular plate having short sides shorter than the diameter of said semiconductor wafer and long sides longer than the diameter of said semiconductor wafer.

14. An electronic circuit system unit according to claim 13 wherein an area being a part of the periphery of said wiring substrate is protruded from the periphery of said semiconductor wafer placed to overlap said wiring substrate, and input/output terminals are disposed in the protruded area.

15. An electronic circuit system unit according to claim 14 wherein said semiconductor wafer is placed to overlap said wiring substrate such that the circuit mounting surface of said wafer and the back surface of said wiring substrate face each other, and an area of the periphery of said semiconductor wafer protrudes from the periphery of said wiring substrate, and the first terminals are disposed on the circuit mounting surface of said semiconductor wafer in a area of the protruded part, and the first terminals and the second terminals are electrically connected to each other through wires.

16. An electronic circuit system unit comprising:

a semiconductor wafer having a substantially disk shape and having a circuit mounting surface;

a plurality of memory units formed on said circuit mounting surface, constituting basic units, which are arranged in a repeated manner on said circuit mounting surface;

a wiring substrate, arranged to overlap said wiring substrate, having an insulating substrate and a wiring layer formed on said insulating substrate, said wiring substrate having a circuit mounting surface and a back surface and comprising a rectangular plate having short sides shorter than the diameter of said semiconductor wafer and long sides longer than the diameter of said semiconductor wafer, said wiring substrate having a periphery area, and a portion of said periphery area protrudes from a periphery of said semiconductor wafer, said wiring substrate having input/output terminals located in said protruded portion;

a semiconductor pellet, mounted on the circuit mounting surface of said wiring substrate in the area where said wiring substrate and said semiconductor wafer overlap each other, having an integrated circuit element formed thereon; means for electrically connecting said integrated circuit element to at least one of said memory units;

means for electrically connecting said integrated circuit element to other circuits, said means having input/output terminals, wherein said integrated circuit element comprises a first means for inputting a data signal through the input/output terminal and for outputting the data signal to the memory unit and second means for outputting a data signal coming in from the memory unit through the input/output terminal.

17. An electronic circuit system unit according to claim 16 wherein said semiconductor wafer overlaps said wiring substrate with the circuit mounting surface of said wafer facing the back surface of said wiring substrate; and wherein a portion of the periphery of said semiconductor wafer protrudes from the periphery of said wiring substrate, and the first terminals are disposed on the circuit mounting surface of said semiconductor wafer in an area of the protruded part, and the first terminals and the second terminals are disposed on a surface of said wiring substrate and are electrically connected to each other through wires.

18. An electronic circuit system unit comprising:

a semiconductor wafer having a circuit mounting surface, a plurality of integrated circuit blocks formed on said circuit mounting surface, constituting basic units, said semiconductor wafer having a substantially disk shape;

a wiring substrate, having an insulating substrate, a wiring layer formed on said insulating substrate, and a circuit mounting surface, comprising a rectangular plate having short sides shorter than the diameter of said semiconductor wafer and long sides longer than the diameter of said semiconductor wafer, said wiring substrate having a periphery area and a portion of said periphery protruding from a periphery of said semiconductor wafer; and a semiconductor pellet mounted on the circuit mounting surface of said wiring substrate in an area where said wiring substrate and said semiconductor wafer overlap each other, and having an integrated circuit element formed thereon, said integrated circuit element being electrically connected to at least one of said integrated circuit blocks.

19. An electronic system unit comprising:

a first semiconductor wafer having a circuit mounting surface;

a first plurality of integrated circuit blocks mounted on said circuit mounting surface of said first semiconductor wafer;

a wiring substrate having a circuit mounting surface, an insulating substrate, a wiring layer on said insulating substrate and a back surface, said wiring substrate arranged to overlap said first semiconductor wafer such that said circuit mounting surface of said first semiconductor wafer faces said circuit mounting surface of said wiring substrate;

a first semiconductor pellet, mounted on said circuit mounting surface of said wiring substrate in an area where said wiring substrate and said first semiconductor water overlap each other, having a first integrated circuit element formed thereon;

first means for electrically connecting said integrated circuit element to at least one of said first plurality of integrated circuit blocks, said means comprising means for electrically connecting said integrated circuit element to said wiring layer, first terminals formed on said circuit mounting surface of said semiconductor wafer, second terminals formed on said circuit mounting surface of said wiring substrate, said second terminals being electrically connected to said wiring layer, a first connecting means, positioned between said first semiconductor wafer and said wiring substrate, for electrically connecting at least one of said first terminals to at least one of said second terminals, said connecting means comprising a connecting wiring substrate having wiring layers, and bump electrode means for connecting said connecting wiring substrate wiring layers to said first and second terminals;

a second semiconductor wafer having a circuit mounting surface;

a second plurality of integrated circuit blocks arranged on said circuit mounting surface of said second semiconductor wafer;

a second semiconductor pellet mounted on said back surface of said wiring substrate in an area where said wiring substrate and said second semiconductor wafer overlap each other, a second integrated circuit element being formed on said second semiconductor pellet;

a second connecting means, positioned between said second semiconductor wafer and said wiring substrate, for electrically connecting said second integrated circuit element and said second plurality of integrated circuit blocks.

* * * * *